United States Patent [19]

Pruniaux et al.

[11] 3,890,163

[45] June 17, 1975

[54] ULTRA HIGH FREQUENCY TRANSISTORS MANUFACTURING PROCESS

[75] Inventors: Bernard R. Pruniaux, Nice; Jean-Louis Assemat, Paris Cedex 16, both of France

[73] Assignee: Societe Lignes Telegraphiques et Telephoniques, Paris, France

[22] Filed: Oct. 31, 1973

[21] Appl. No.: 411,281

[30] Foreign Application Priority Data

Nov. 10, 1972 France .......... 72.39949

[52] U.S. Cl. .......... 148/1.5; 357/91

[51] Int. Cl. .......... H01l 7/54

[58] Field of Search .......... 148/1.5; 357/91

[56] References Cited

UNITED STATES PATENTS

| | | | |
|---|---|---|---|
| 3,328,210 | 6/1967 | McCaldin et al. | 148/1.5 |
| 3,513,035 | 5/1970 | Fitzgerald et al. | 148/1.5 |
| 3,615,875 | 10/1971 | Morita et al. | 148/1.5 |
| 3,635,767 | 1/1972 | Tsuchimoto | 148/1.5 |
| 3,660,171 | 5/1972 | Tsuchimoto et al. | 148/1.5 |
| 3,756,861 | 9/1973 | Payne et al. | 148/1.5 |
| 3,793,088 | 2/1974 | Eckton, Jr. | 148/1.5 |

*Primary Examiner*—L. Dewayne Rutledge
*Assistant Examiner*—Arthur J. Steiner
*Attorney, Agent, or Firm*—Kemon, Palmer & Estabrook

[57] ABSTRACT

The production sequence of the UHF transistors includes at least one ion implantation step for doping the emitter, which takes place after doping of the base, through an emitter window etched from a thin oxide layer closing the base window previously etched from a thick oxide layer. This ion implantation is followed by an anneal in neutral atmosphere while the emitter window remains open, at a temperature lower than 1000°C in the case of silicon. The base is doped either by diffusion or ion implantation. Two further ion implantations are used to degenerate the base contact area and to reduce transversal base resistance.

9 Claims, 7 Drawing Figures

ULTRA HIGH FREQUENCY TRANSISTORS MANUFACTURING PROCESS

BACKGROUND OF THE INVENTION AND PRIOR ART

The invention relates to a manufacturing process for producing UHF planar transistors operating at a frequency higher than 1 GHz. These transistors are made of a semiconductor material which constitutes the basis for the collector area. A first pn junction is established between the collector and the base region and a second pn junction is made within the base region to delimit the emitter region. Metal layers are coated on the surface to establish contact with the different semiconducting regions. The several electrode shapes currently used are described in the article by H. F. COOKE entitled: "Microwave transistors theory and design" published in the Proceedings of the Institute of Electrical and Electronic Engineers - Volume 59 - August 1971 issue page 1163.

One of the highest difficulties in the design of UHF planar transistors lies in the very small thicknesses of the several regions. It is therefore necessary to provide a very high definition of the location of the junctions beneath the surface of the semiconductor. This precision cannot be obtained when doping is achieved through diffusion of an impurity due to the displacement of the junction plane during further thermal treatments. This is one of the reasons why ion implantation doping is used for producing UHF transistors. This process is described in the article by James F. GIBBONS entitled: "Ion Implantation in Semiconductors-Part I Range Distribution Theory and Experiments" in the Proceedings of the IEE, Volume 56, No. 3 issue March 1968. This process allows to limit the heat treatments during production to a temperature lower than 1000°C. Several publications have been made describing production of transistors using ion implantation doping. For instance the French Pat. No. 2,096,876 filed on July 9th, 1970 and assigned to Compagnie Francaise THOMSON-HOUSTON for "Realisation d'une structure de transistor fonctionnant a tres haute frequence" discloses a process according to which the emitter is first doped by diffusion and the base is doped by ion implantation through the emitter. In this process the chronological sequence of the steps is reverse to the geometrical sequence in the transistors. It requires electronic or ion machining of the mask to be used during the ion implantation step. This mask is difficult to produce and its cost is very high. All the processes using this chronological sequence are very difficult to operate with the geometrical precision necessary to the performance of the transistor at such high frequencies. U.S. Pat. No. 3,390,019 filed on Dec. 24th, 1964 and assigned to SPRAGUE discloses a manufacturing process which requires two successive ion implantations to build up successively the base and the emitter regions. The transversal dimensions of the implanted regions are controlled through control of the cross section of the ion beam. Such a process allows only designs with circular and concentric regions to be produced. Such a control of the transversal dimension is a high skill technical step and does not easily allow non circular designs. Usual shape of GHz transistors is non circular.

BRIEF DISCLOSURE OF THE INVENTION

The invention consists in a manufacturing process for producing UHF transistors in which at least the emitter region is ion implanted. Its main feature lies in the following sequence of operations: after doping of the base, the emitter window is photo-etched from a thin oxide layer through which the emitter is ion implanted; this step is immediately followed by annealing at a temperature lower than 1000°C when the semiconductor material consists of silicon. Base doping may be achieved either by diffusion or by ion implantation through a window photo-etched from a thick oxide layer. By thick oxide layer is meant a layer having several tenths of micron thick; by thin layer is meant a layer the thickness of which is at most equal to 0.1 micron. The use of a thick oxide layer to outline the base window provides for passivation of the collector to base junction during further processing steps including ion implantation of the emitter. In a variant of the process only one window corresponding to the emitter geometry is used. Broadening of the base region is achieved before emitter implantation through anneal at a temperature lower than 1000°C. This variant saves one mask (the base window mask) and one photo-etching step.

According to a further feature of the invention a third ion implantation is made through the base contact window in order to increase the base conductivity in the vicinity of the base contact. In this variant the same anneal step is used for all the implantations.

According to another feature of the invention, a fourth ion implantation step is used after contact metallization using the contacts as a mask in view of reducing the transversal resistance of the base region.

DETAILED DESCRIPTION OF THE INVENTION

The invention will be fully understood by reference to the following description of some particular embodiments of the process and the accompanying drawings in which FIGS. 1, 2, 3 and 4 show flow sheets of four embodiments of the invention. The description is directed to processing of n-type silicon material. This selection of material is made for illustration sake only. The process is applicable irrespective of the nature of the base material. As usual in the production of npn transistor, the starting material consists of a $n^+$ substrate on which lies an epitaxial layer of $n$ material. On this structure are built the base and the emitter regions.

EXAMPLE 1

Figure 1:
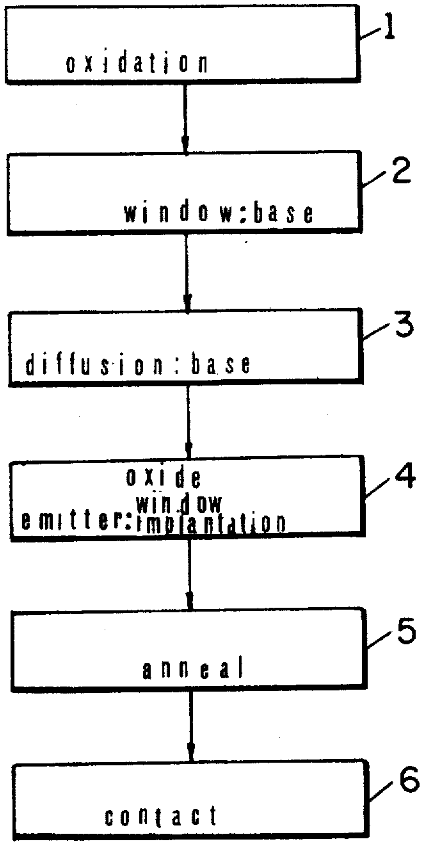
FIGS. 1 to 4 inclusive are flow sheets representing different embodiments of the manufacturing process of the present invention.
Figure 1A:
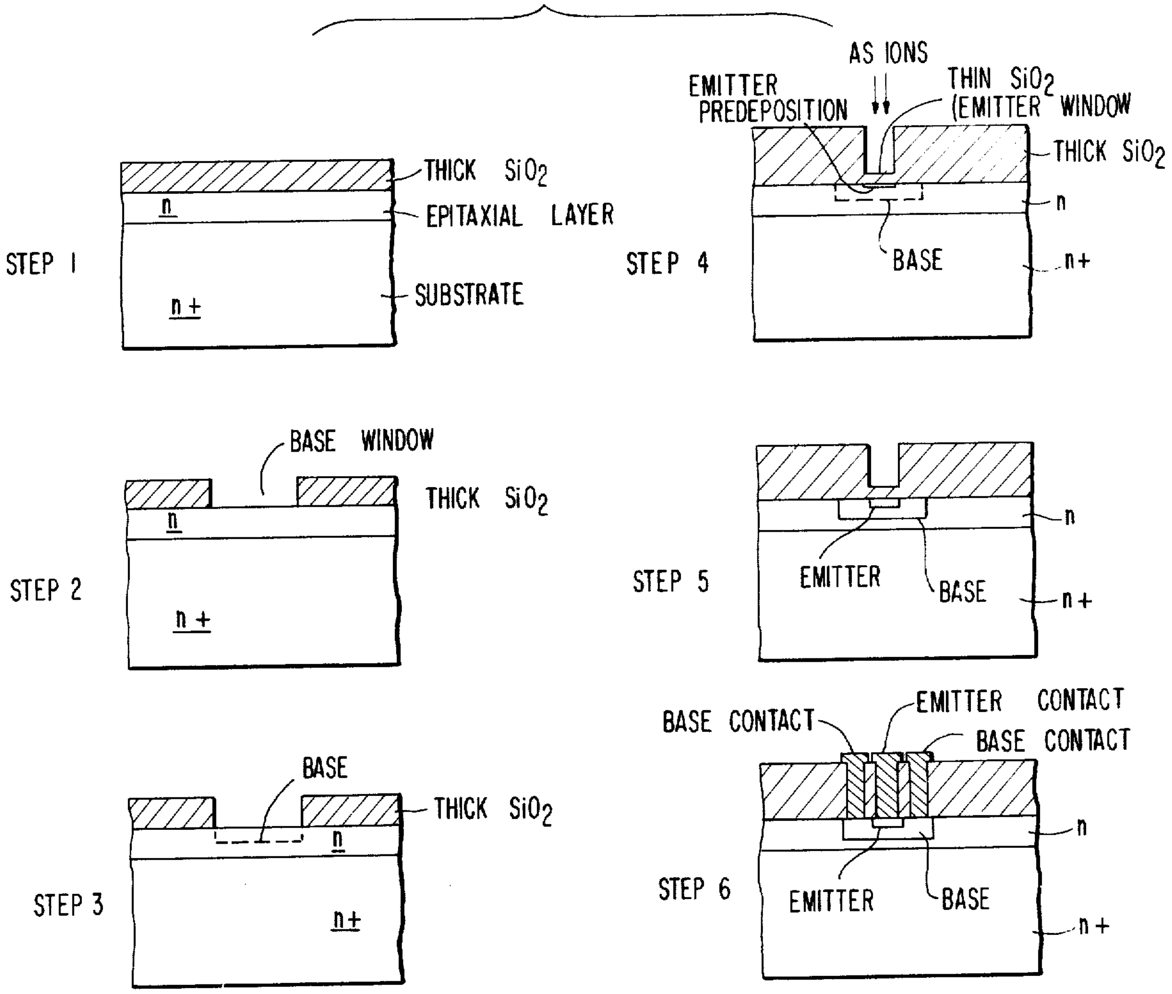
FIGS. 1A, 2A and 3A illustrate the structures which result from performance of individual steps of the processes illustrated in FIGS. 1 to 4.

Referring now to FIGS. 1 and 1A, the surface is first covered with a thick layer of silicon oxide (step 1) through humid atmosphere oxidation at a temperature somewhat lower than 1000°C, according to well known practice. The thickness of the oxide layer is about 0.9 micrometer. In step 2, a window is photoetched out of this layer which outlines the base. This p-type region is obtained in step 3 through diffusion of boron through the window so that the p-n junction plane between the n-type collector region and the $p^+$ type base region is set at the desired distance from the upper surface (about 0.5 micron below the surface). The surface of the silicon is further oxidized (thin oxide film) and the emitter window is photoetched. The emitter is doped through bombardment with arsenic ions at 50 keV with a beam current of $2.10^{15}$ to $6.10^{15}$ ions/cm$^2$ (step 4). The structure is then annealed (step 5) at about 1000°C for a duration which depends on the desired position of the emitter to base junction. Typical durations extend from 5 to 25 minutes. Doping of the emitter region is between $2\times10^{20}$ and $6\times10^{20}$ ions/cm$^3$. Annealing causes a diffusion of the arsenic ions. It is achieved with the emitter window open, in an inert atmosphere. This will prevent any absorption of arsenic by a superficial oxide layer which could give back arsenic ions to the silicon crystal during further thermal treatments. Step 6 concerns the establishment of the base and the emitter contacts according to well-known process which can be summed up in the following way: base contact and emitter windows are photoetched from the oxide layer. Then the complete surface is covered with one or several successive metal layers. Such metal layers are removed from the surface except at the location of the contact windows. The emitter processing has been shown as a unique step 4 though it has been described as a 3 step processing: oxidation-window opening by etching and doping. According to a variant both the oxidation and window opening by etching steps can be saved. In this process step 2 consists in opening the emitter window. The base is diffused through this window. Due to thermal conditions there is a spread of the base region during or after diffusion (anneal) before ion implantation of the emitter through the same window (step 4).

EXAMPLE 2

Figure 2:
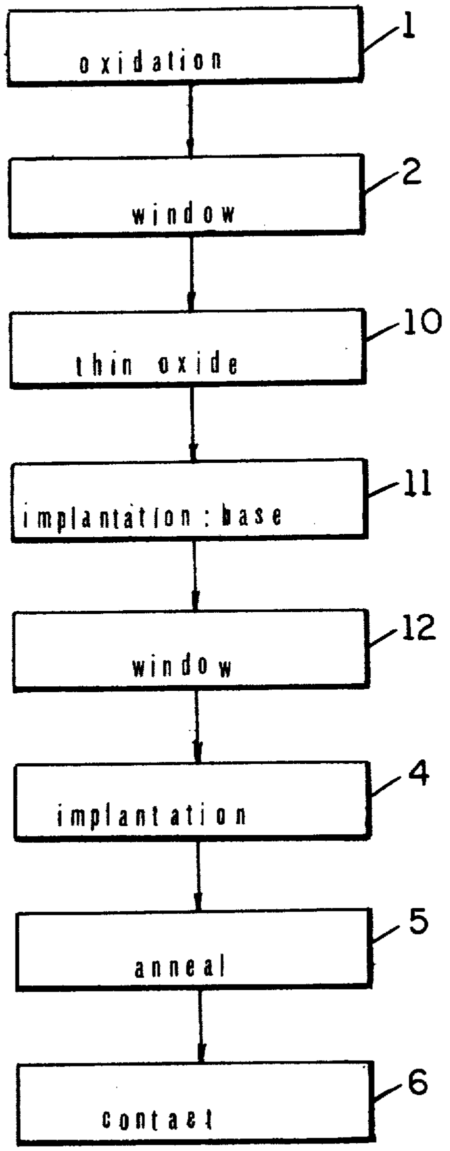
Figure 2A:
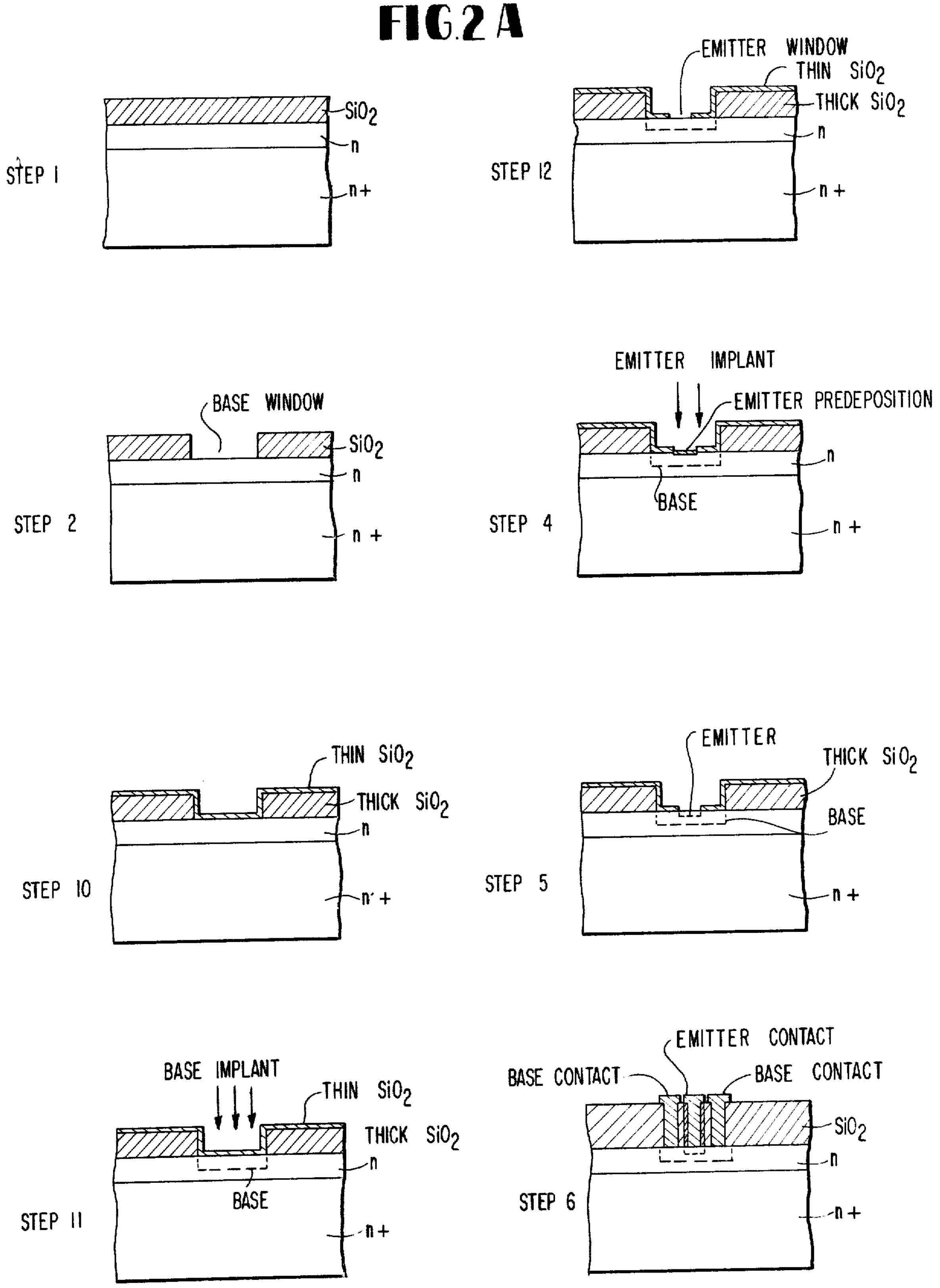

FIGS. 2 and 2A show the manufacturing steps of a production according to the invention in which both the base and the emitter are doped by ion implantation. The steps which are common to both the first and second embodiments bear the same reference numerals. The thick oxide layer is deposited on the epitaxial layer of the silicon (step 1). A base window is photoetched in this layer (step 2). A thin oxide layer (about 0.1 micron) is deposited on the surface through the same process as described in reference to step 1, the duration of the oxidation is reduced. Base doping by ion implantation through the thin oxide layer is obtained using a boron ion beam accelerated between 100 and 150 keV with an intensity between $5.10^{12}$ and $2.10^{13}$ ions/cm$^2$. The intensity controls the gain of the completed transistor. The location of the collector to base junction under these conditions is from 0.15 to 0.5 micrometer below the surface (step 11). An emitter window is then photoetched from the thin oxide layer (step 12). Doping of the emitter is achieved by arsenic ion implantation through this window with arsenic beam parameters as mentioned in the first example (step 4). Steps 10, 12 and 4 were previously consecutive and shown at step 4 in FIG. 1. Further steps 5, 6 are identical to the steps mentioned in the first example.

EXAMPLE 3

Figure 3A:
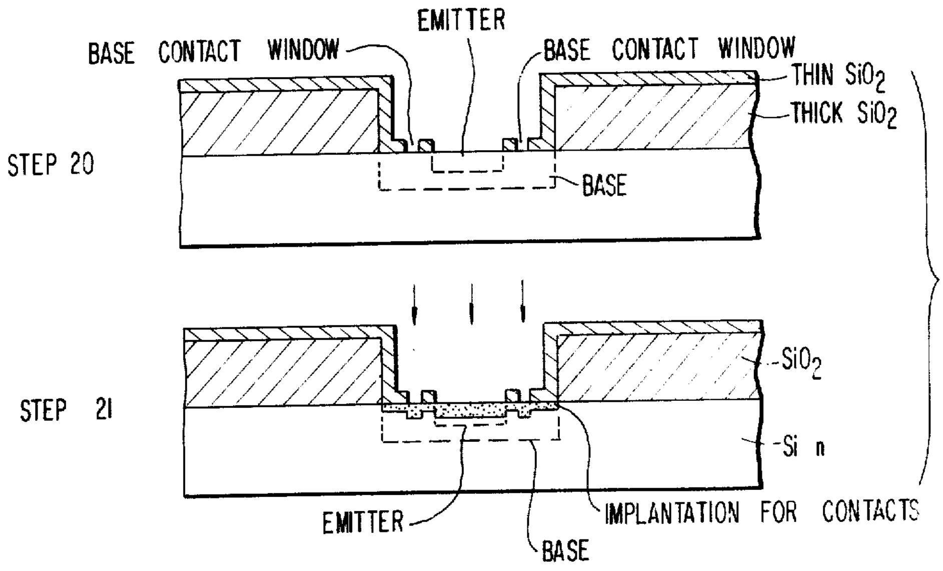
Figure 3:
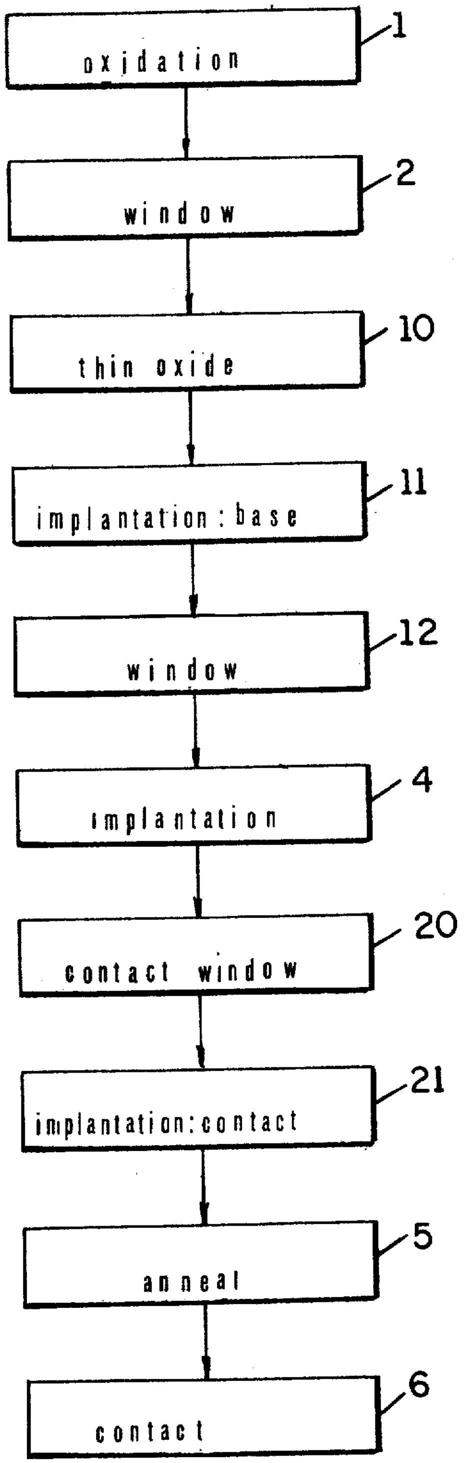

FIGS. 3 and 3A show the steps of the process requiring three successive ion implantations to build up respectively the base region, the emitter region and a low resistivity base contact region in part of the base region. Steps 1, 2, 10, 11, 12 and 4 have already been described. After the emitter implantation, a base contact window is etched from the thin oxide layer (step 20). The region surrounding the contact window is degenerated by a third superficial ion implantation by means of a boron ion beam accelerated at 30 to 50 keV with a minimum intensity of $2.10^{15}$ ions/cm$^2$. Step 5 corresponding to the annealing operation then takes place as already mentioned. Step 6 completes the transistor structure.

EXAMPLE 4

Figure 4:
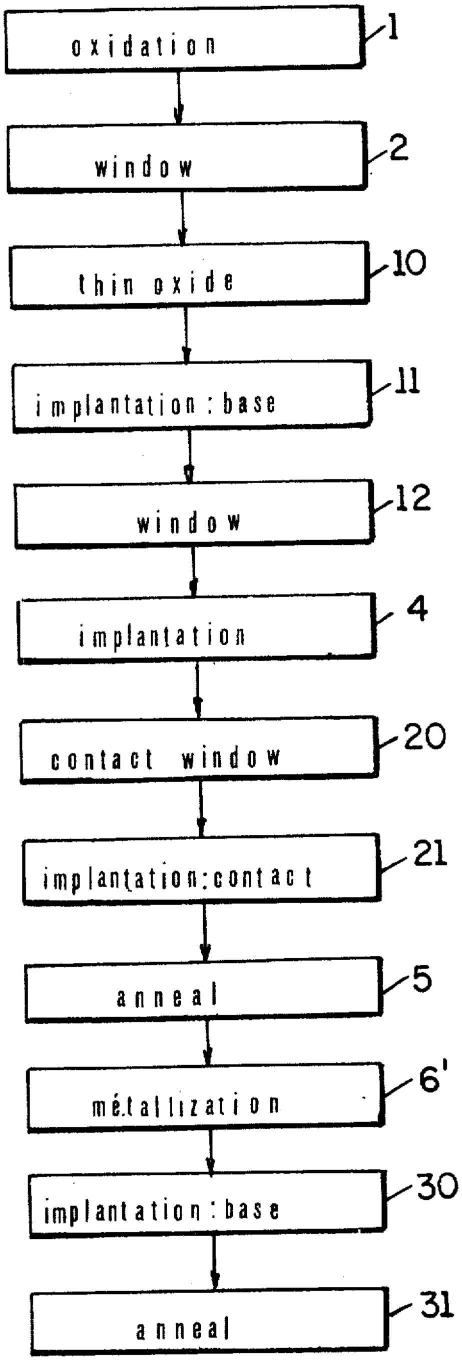

FIG. 4 shows the operating sequence of a manufacturing procedure according to the invention in which four successive ion implantations are used. The fourth implantation is performed after metallization of the contacts (step 6) using such metal contacts as a mask against ion penetration in order to reduce the transversal resistance of the base region. As well known, this is particularly important in UHF transistor structures. Steps 1, 2, 10, 11, 12, 4 follow the corresponding steps in FIG. 3. The semiconductor comprises an ion implanted base (step 11), an ion implanted emitter (step 4) and a superficial degenerated base contact area (step 21). The metal contacts are then deposited on the surface (step 6'). In the previous procedures, the metal contacts could be made by any known process. In the present case, it is preferred to build up the contacts according to the teaching of U.S. Pat. Nos. 3,287,612 filed on Dec. 17th, 1963, 3,271,286 filed on Feb. 25th, 1964 and 3,335,338 filed on Aug. 7th, 1964 assigned to WESTERN ELECTRIC Company and U.S. Pat. No. 3,274,670 filed on Mar. 18th, 1965 and assigned to BELL TELEPHONE LABORATORIES for "Semiconductor contact". This process consists, once the contact windows are photoetched, in the following metal layer deposition: a thin layer of platinum by cathodic sputtering followed by heating to allow formation of an alloy between silicon and platinum; then a layer of molybdenum followed by a rather thick layer of gold are deposited. The layers are then etched as usual.

This contact establishing procedure is preferred in the present embodiment because the contacts will be used as a mask in the further step 30 which consists in a third boron implantation with a beam accelerated between 80 and 140 keV with a minimum intensity of $2.10^{15}$ ions/cm$^2$. This rather deep implantation is used in order to decrease the transversal resistance of the transistor base region. It is followed by annealed treatment 31 at a temperature between 550° and 850°C during approximately 30 minutes.

EXAMPLE 5

A variant of the process shown in FIG. 3 which has given good results is as follows. Steps 1 and 2 will provide a base window out of a thick oxide layer; step 10 covers the surface with a thin oxide layer. The base implantation is achieved through this thin film oxide according to step 11 in Example 2. Then a second boron ion implantation is performed though the same thin oxide film on the base window with a beam of at least $2.10^{15}$ ions/cm$^2$ accelerated from 50 to 80 keV. This second boron implantation is used to degenerate the silicon at the base contact location and corresponds to step 21 in FIG. 3. Then the emitter window is opened (step 12) and further steps 4, 5, 6 are the same as above.

Typical datas concerning transistors produced according to Examples 2 and 5 are listed below. The transistors are designed for operation at 3 GHz, with a maximum frequency of 6 GHz and average gain of 88.

| | Example 2 | Example 5 |
|---|---|---|
| $V_{CBO}$ | 54 V | 34 V |
| $V_{CEO}$ | 46 V | 24 V |
| $V_{EBO}$ | 7 V | 4 V |
| $G_{max}$ at 2 GHz | 9.5 dB | 9.5 dB |
| $S_{21}$ at 2 GHz | 4 dB | 6 dB |

Multi-step implantation is no technical problem and will not induly increase the cost since it is a batch operation which will be performed simultaneously on a large quantity of transistor units. The above description has always referred to a transistor structure but it is obvious that every one of the mentioned steps is a batch operation to be performed on a wafer which will be ultimately cut into individual transistor chips. Most of the variants described require three masks (base and emitter and contacts), however the variant mentioned at the end of the first example allows production with two masks (a base mask is no longer required).

What we claim is:

1. Process for manufacturing a planar UHF transistor with the emitter region enclosed within the base region starting from a semiconducting body of regular lattice organization coated with an epitaxial layer of low first type of conductivity, part of which constitutes the collector region, comprising the following steps:
   oxidizing said epitaxial layer up to several tenths of micrometer thick in humid atmosphere to form a thick oxide layer;
   photoetching a first window in said oxide layer according to a base pattern;
   diffusing a first impurity of a second type of conductivity through said first window;
   oxidizing a second time said epitaxial layer including said first window up to about 0.1 μm thick in humid atmosphere to form a thin oxide layer;
   photoetching a second window for the emitter in said thin oxide layer within said first window;
   ion implanting a second impurity of said first conductivity type through said second window so as to predeposit the emitter dopant;
   annealing said body in a neutral atmosphere below 1,000° C, so as to diffuse said emitter dopant and rearrange the lattice which had been disturbed by said implantation;
   photoetching a third window in said thin oxide layer outlining the base contacts; and
   metallizing said second and third window areas on the upper face of said epitaxial layer.

2. Process for manufacturing a planar UHF transistor with the emitter region enclosed within the base region starting from a semiconducting body of regular lattice organization coated with an epitaxial layer of low first type of conductivity part of which constitutes the collector region comprising the following steps:
   oxidizing said epitaxial layer up to several tenths of micrometer thick in humid atmosphere to form a thick oxide layer;
   photoetching a first window in said oxide layer outlining the emitter;

diffusing a first impurity of the second type of conductivity through said window;
   annealing said body in a neutral atmosphere to spread said first impurity according to the base geometry;
   ion implanting a second impurity through said window of the first type of conductivity so as to predeposit the emitter dopant;
   heating said body in a neutral atmosphere below 1,000° C, in order to diffuse said emitter dopant and rearrange the lattice which had been disturbed by said implantation;
   photoetching a second window in said oxide layer outlining the base contacts; and
   metallizing said first and second window locations.

3. Process for manufacturing a planar UHF transistor with the emitter region enclosed within the base region starting from a semiconducting body of regular lattice organization coated with an epitaxial layer of low first type conductivity part of which constitutes the collector region comprising the following steps:
   oxidizing said epitaxial layer up to several tenths of micrometer thick;
   photoetching a first window in said oxide layer for the base;
   oxidizing a second time said epitaxial layer including said first window up to about 0.1 μm thick in humid atmosphere to form a thin oxide layer;
   ion implanting a first impurity with the second conductivity type through said first window covered with said thin oxide layer;
   photoetching a second window for the emitter within the thin oxide layer covering said first window;
   ion implanting a second impurity through said second window of said first conductivity type in order to predeposit the emitter dopant;
   annealing said body in a neutral atmosphere below 1,000° C, to diffuse said emitter dopant and rearrange the lattice which had been disturbed by said implantation;
   photoetching a third window in said second oxide layer outlining the base contact; and
   metallizing said second and third window areas on the upper surface of said material.

4. Process for manufacturing a planar UHF transistor with the emitter region enclosed within the base region starting from a semiconducting body of regular lattice organization coated with an epitaxial layer of low first type conductivity part of which constitutes the collector region comprising the following steps:
   oxidizing said epitaxial layer up to several tenths of micrometer thick;
   photoetching a first window in said oxide layer according to the base geometry;
   oxidizing a second time said epitaxial layer including said first window up to about 0.1 μm thick to form a thin oxide layer;
   ion implanting a first impurity with the second conductivity type through said first window covered by said thin oxide layer;
   photoetching a second window for the emitter in said thin oxide layer within said first window;
   ion implanting a second impurity through said second window of said first conductivity type in order to predeposit the emitter dopant;

photoetching a third window in said thin oxide layer outlining the base contacts within said first window;

ion implanting a third impurity of the second conductivity type through said second and third windows;

annealing said body in a neutral atmosphere below 1,000°C, so as to diffuse the implanted ions and rearrange the lattice; and metallizing said second and third window areas on the upper face of said epitaxial layer

5. Process for manufacturing a planar UHF transistor with the emitter region enclosed within the base region starting from a semiconducting body of regular lattice organization coated with an epitaxial layer of low first type conductivity part of which constitutes the collector region comprising the following steps:

oxidizing said epitaxial layer up to several tenths of micrometer thick;

photoetching a first window in said oxide layer according to the base geometry;

oxidizing a second time said epitaxial layer including said first window up to about 0.1 $\mu$m thick in order to form a thin oxide layer;

ion implanting a first impurity with the second conductivity type through said first window covered with said thin oxide layer;

photoetching a second window for the emitter in said thin oxide layer within said first window;

ion implanting a second impurity through said second window of said first conductivity type;

photoetching a third window in said thin oxide layer outlining the base contacts within said first window;

ion implanting a third impurity of the second conductivity type through said second and third windows to degenerate said epitaxial layer at the contact locations;

annealing said body in a neutral atmosphere below 1,000° C so as to diffuse the implanted ions and rearrange the lattice;

metallizing said second and third window areas on the upper face of said body; and ion implanting a fourth impurity of said second conductivity type using said metallized areas as a mask for reducing the lateral base resistance.

6. Process for manufacturing a planar UHF transistor with the emitter region enclosed within the base region starting from a semiconductive body coated with an epitaxial layer of low first type conductivity part of which constitutes the collector region comprising the following steps:

oxidizing said epitaxial layer up to several tenths of micrometer thick;

photoetching a first window in said oxide layer outlining the emitter;

ion implanting through said window a first impurity with the second conductivity type;

annealing said body in a neutral atmosphere so as to diffuse said implanted ions according to the base geometry;

ion implanting a second impurity through said window of the first type of conductivity so as to predeposit the emitter dopant;

heating said body in a neutral atmosphere below 1,000° C, so as to diffuse said emitter dopant and rearrange the lattice;

photoetching a second window in said thin oxide layer outlining the base contacts; and metallizing said first and second window locations.

7. Process for manufacturing a UHF transistor according to claim 3 in which said semiconductive body is n type silicon, said first impurity is boron, said second impurity is arsenic.

8. Process for manufacturing a UHF transistor according to claim 4 in which said first and third impurities are the same.

9. Process for manufacturing a UHF transistor according to claim 5 in which said first, third and fourth impurities are the same.

* * * * *